(12) United States Patent
Przybylski

(10) Patent No.: US 8,806,305 B2
(45) Date of Patent: *Aug. 12, 2014

(54) ERROR DETECTION AND CORRECTION CODES FOR CHANNELS AND MEMORIES WITH INCOMPLETE ERROR CHARACTERISTICS

(71) Applicant: MOSAID Technologies Incorporated, Ottawa (CA)

(72) Inventor: Steven Przybylski, Ann Arbor, MI (US)

(73) Assignee: Conversant Intellectual Property Management Inc., Ottawa (CA)

(*) Notice: Subject to any disclaimer, the term of this patent is extended or adjusted under 35 U.S.C. 154(b) by 0 days.

This patent is subject to a terminal disclaimer.

(21) Appl. No.: 13/865,514

(22) Filed: Apr. 18, 2013

(65) Prior Publication Data
US 2013/0232393 A1 Sep. 5, 2013

Related U.S. Application Data

(63) Continuation of application No. 12/907,210, filed on Oct. 19, 2010, now Pat. No. 8,429,495.

(51) Int. Cl.
*H03M 13/00* (2006.01)
(52) U.S. Cl.
USPC .......................................... 714/777; 714/763
(58) Field of Classification Search
USPC ........................................ 714/763, 759, 777
See application file for complete search history.

(56) References Cited

U.S. PATENT DOCUMENTS

| | | | |
|---|---|---|---|
| 5,048,023 A * | 9/1991 | Buehler et al. ................. | 714/773 |
| 8,296,623 B2 | 10/2012 | Cassuto et al. | |
| 8,307,257 B2 | 11/2012 | Poirrier et al. | |
| 8,429,495 B2 * | 4/2013 | Przybylski .................... | 714/763 |
| 2008/0168320 A1 * | 7/2008 | Cassuto et al. ................. | 714/746 |
| 2008/0195887 A1 * | 8/2008 | Luk et al. .......................... | 714/5 |
| 2009/0210771 A1 * | 8/2009 | Yang et al. .................... | 714/763 |

OTHER PUBLICATIONS

Kaneko et al., "A class of M-ary Asymmetric Symbol Error Correcting Codes for Data Entry Devices," IEEE Transactions on Computers, IEEE Service Center, Los Alamitos, CA, US, vol. 53, No. 2, Feb. 1, 2004, pp. 159-167, XP011106092, ISSN: 0018-9340, DOI: 10.1109/TC.2004.1261826.

(Continued)

*Primary Examiner* — Philip Guyton
(74) *Attorney, Agent, or Firm* — Dennis R. Haszko

(57) ABSTRACT

A channel has a first and a second end. The first end of the channel is coupled to a transmitter. The channel is capable of transmitting symbols selected from a symbol set from the first end to the second end. The channel exhibits incomplete error introduction properties. A code comprises a set of code words. The elements of the set of code words are one or more code symbols long. The code symbols are members of the symbol set. The minimum modified Hamming separation between the elements of the set of code words in light of the error introduction properties of the channel is greater than the minimum Hamming distance between the elements of the set of code words. A memory device, a method of using the channel, and a method of generating the code are also described.

21 Claims, 4 Drawing Sheets

(56) References Cited

OTHER PUBLICATIONS

Kaneko et al., "Nonsystematic M-ary Asymmetric Error Correcting Codes Designed by Multilevel Coding Method," Dependable Computing, 2004, Proceedings, 10th IEEE Pacific Rim International Symposium on Mar. 3-5, 2004, Piscataway, NJ, USA, IEEE, Mar. 3, 2004, pp. 219-226, XP010690452, DOI: 10.1109/PRDC.2004.1276572, ISBN: 978-0/7695-2076-6.

Ahlswede et al., "On q-ary Codes Correcting All Unidirectional Errors of a Limited Magnitude," Internet Citation, Jul. 27, 2006, pp. 1-22, XP002484486, URL: http://axiv.org/abs/cs/0607132 (as retrieved on Jun. 13, 2008).

* cited by examiner

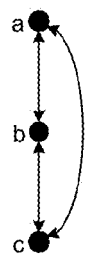 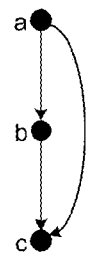 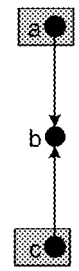 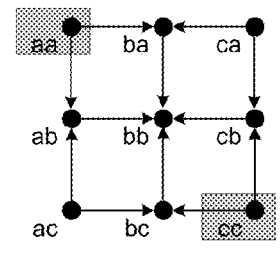
Figure 7        Figure 8        Figure 9        Figure 10
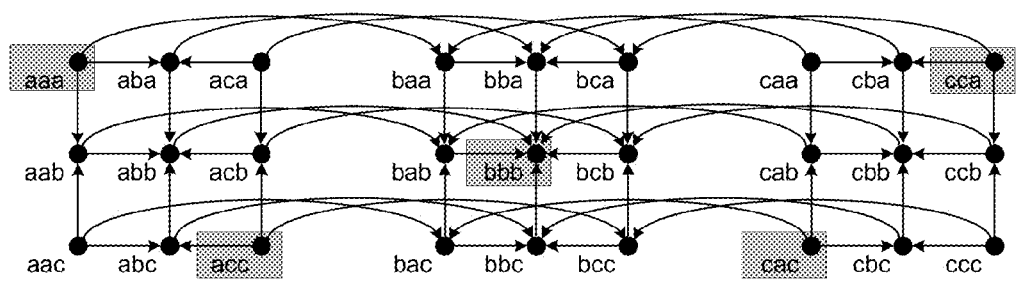
Figure 11
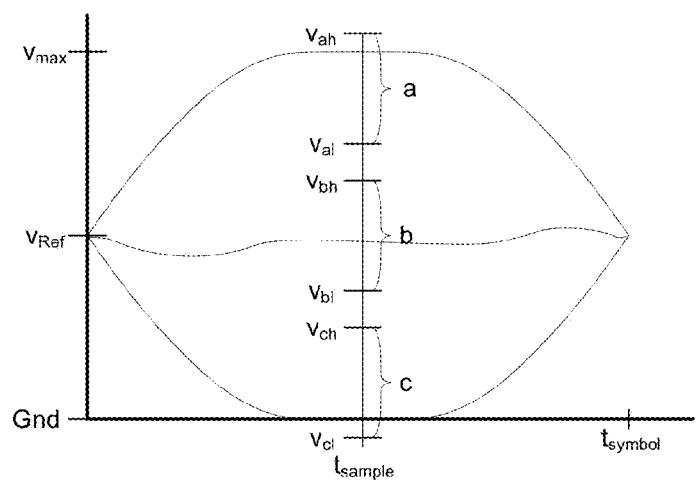
Figure 12

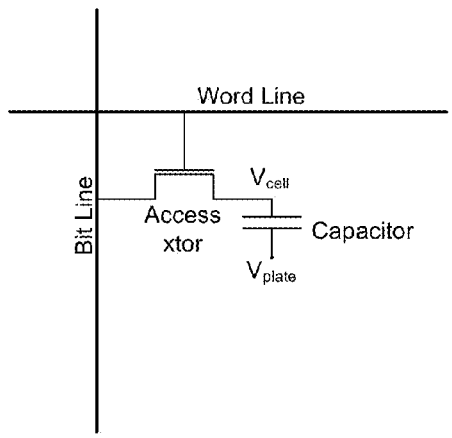
Figure 13 (Prior Art)
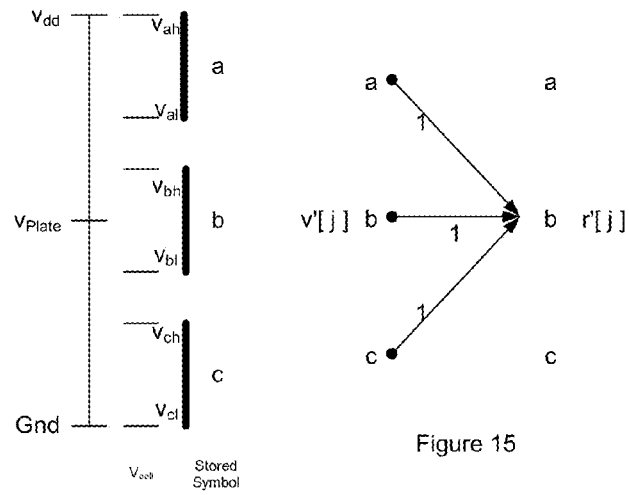
Figure 14
Figure 15
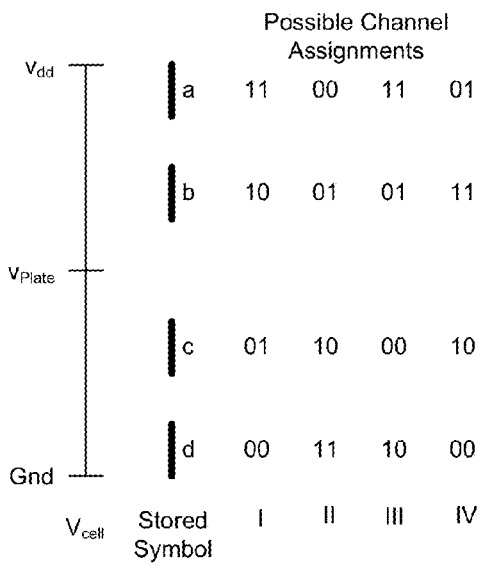
Figure 16
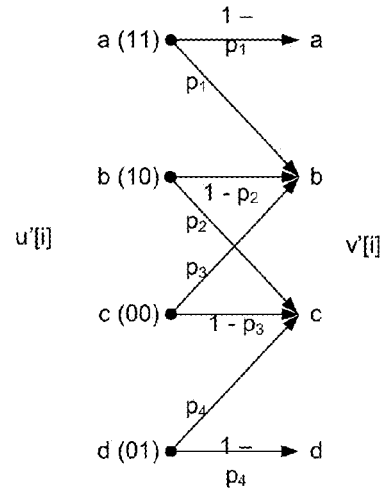
Figure 17

ERROR DETECTION AND CORRECTION CODES FOR CHANNELS AND MEMORIES WITH INCOMPLETE ERROR CHARACTERISTICS

CROSS REFERENCE TO RELATED APPLICATIONS

The present application is a continuation application claiming priority from U.S. patent application Ser. No. 12/907,210 filed on Oct. 19, 2010, the content of which is herein incorporated by reference in its entirety.

FIELD OF THE INVENTION

The present invention relates to error detection and correction codes as they apply to storage and communication applications, and more specifically to a method, apparatus and system for efficiently detecting and/or correcting errors in circumstances in which the errors that are possible are related to the stored or communicated data.

BACKGROUND TO THE INVENTION

Error detection and correction codes have been in use in electronic systems to reduce the probability of errors being introduced into data being stored or communicated in the face of physical and electrical phenomena that introduce errors into the data. For example, FIG. 1 shows a typical conceptualization of a communication system. The underlying model of the communication system is that a serial data stream needs to be sent from the source 101 to the destination 109. The source data is first passed through a source encoder 102 that compresses the original serial source data stream X by removing any redundancy in it. The channel encoder 103 adds redundancy in a controlled and systematic fashion in order to facilitate detecting any errors introduced between the channel encoder 103 and the channel decoder 107, possibly with the option of correcting those errors as well. The errors are generally assumed to be introduced by an imperfect channel 105 which, due to noise or other physical or electrical phenomena, cause the symbol stream r' coming out of the channel 105 to be different from the symbol stream v' going into the channel 105. It is the channel encoder 103, then, that typically introduces the error correction code (ECC) into the data stream.

The channel modulator 104 has the purpose of translating the incoming bit stream v into the electrical signals of the channel 105. In the case of a binary digital channel, the modulator is straightforward—it typically passes the encoded data stream v directly and unchanged to the channel such that v'=v. However, there are channels that communicate symbols one at a time, selected from a symbol set that has more than two elements. For example, if a communications channel is able to send one of four voltages during each data transmission time period, then the size of the symbol set is 4. In general, the transmitted symbols v'[j] are selected from the set of symbols $S=\{s_0, s_1, s_2, \ldots s_l\}$, where the size of the symbol set is l. Those skilled in the art would understand that there are many such channels, particularly, for example, those using phase-shift keying (PSK) amplitude modulation, and multi-bit-per-cell Flash or DRAM memories. In these cases, the channel modulator 104 takes two bits of the input stream v to choose one symbol of symbol stream v'. In the case of a binary digital channel, the symbols that make up symbol stream v', whether they are represented by currents, voltages, charges, or some other quantity, are easily associated with the binary digits 0 and 1. For binary channels, the size of the symbol set l=∥S∥ is 2. In light of this association, and as indicated above, in this case, typically v' can be viewed as being the same as v, though other relationships are possible. One common alternative is, for example, for v' to equal the complement of v.

Regardless of the size of the symbol set S, the noise or otherwise induced errors introduced in the channel would change one communicated or stored symbol into another, as will be discussed later.

The role of the channel demodulator 106 is to convert the received symbol stream r' into a binary received encoded data stream r. Depending on what errors were introduced into the symbol stream by the channel, the received encoded data stream r is a close but not exact replica of the encoded data stream v, though probably, but not necessarily, shifted in time. The amount of time shift depends on whether the channel is a communications channel, in which case, the time delay is equal to the propagation delay through the modulator 104, the channel 105, and the demodulator 106. In the case that the channel is a memory device, the time shift between v and r can be substantial, particularly in the cases in which the symbol stream v' is embedded into the memory when the memory is manufactured (such as, for example, CDs and DVDs).

The role of the channel decoder 107 is to remove the redundancy introduced by channel encoder 103 in order to produce the corrected data stream w. If the error correction code is well designed with the channel's characteristics in mind, then the errors introduced into the received symbol stream r' are removed so that there is a very high probability that each and every bit in decoded data stream w is identical to the corresponding bit in the compressed data stream u. Some error correction codes are able to detect some classes of errors that they are unable to correct. When these codes are used, then occasionally, in the presence of a detectable but uncorrectable error in the received symbol stream, the corrected data stream is known to be erroneous and this knowledge is generally communicated to a control mechanism to prevent the erroneous corrected data from being used until the information can be regenerated and/or resent.

The final phase of the process is the source decoder 108, which undoes the data compression performed on the data stream by the source encoder 102 to produce a final received data stream x' that is ideally identical to the source data stream x. However, many communications and memory systems do not include a source encoder/source decoder pair. Under such circumstances, the input to the channel encoder 103 would be the raw source data stream, and the output of the channel decoder 107 would be the final received data stream x' that is sent to the data's destination 109.

FIG. 2 shows a simplified view of a communications or storage system, one in which there is no source encoder or source decoder, and in which the channel is a binary digital channel so that the transmitted symbols are the same as the encoded data stream bits. The channel moderator and demodulators are therefore effectively pass-through devices without significance to the overall system. The result is that the only blocks of significance are the channel encoder 202 and the channel decoder 204. In this figure the channel 203 is represented by a binary addition, which is functionally equivalent to a single exclusive OR gate. In this conceptualization of the channel and the errors, the error stream e is a binary bit stream of equal length to the encoded data stream v. A one in the error stream means an error is injected into the data stream by the channel at that bit position. The nature of the binary addition function is that the presence of an error changes a zero in the data stream to a one and vice versa. In this conceptualization of the channel, the errors are independent of the data in that a one in the error stream causes an error regardless of whether the data bit in the corresponding position in the encoded data stream is a zero or a one. In addition, the probability of an error being introduced is considered to be constant from one symbol to the next. This type of channel is referred to as a Binary Symmetric Channel (BSC). There are other channel models which include the concept that the probability of an error in one bit position is related to the probability that an error occurred in the previous bit position. These channels are the to have memory and they experience bursts of closely spaced errors.

FIG. 3 shows another simplification of the general communications system of FIG. 1, in this case with the names of the terms changed to reflect a storage application. In these applications, the communications channel is replaced by a memory device 303. The memory device can be a physically static devices such as, for example, one or more CDs or DVDs, active devices such as semiconductor memories, such as, for example, dynamic random access memories (DRAMs), Flash memories, or Read Only Memories (ROMs); or any other manner of device whose function is in part to store information for a period of time. In this conceptualization, the channel encoder is called an ECC encoder 302. The encoded data stream is written into the memory device either once at manufacture, once in the field, or repeatedly as the device is being used. The received data stream r is generally retrieved from the memory devices via read operations of one type or another depending on the specifics of the memory device. In the case of a random access memory device, the data need not be retrieved in the order written, and the association between written symbols and read symbols is by implicitly or explicitly provided address. It will be understood that the ECC Decoder can reside without limitation within the memory controller or within the memory device integrated circuit or anywhere in between as a discrete device or between the memory controller and the data destination.

Memory devices typically store information in memory cells. The majority of memory types store a single bit of information in each memory cell. For these devices, the symbol set is the set of binary digits zero and one and there is no corresponding channel modulator. The exception is that in many semiconductor memory types there is an inversion that exists along the signal path that carries the encoded data bits v[i] to the memory cells so that the stored symbols are in some way inverted from the encoded data bits for some or all of the storage cells.

There also exist memory devices, both commercially available and proposed in the literature of the art, which store symbols from a larger symbol set in each memory location. For example, many multi-level Flash memory devices program each memory cell to one of four levels, thereby storing two bits worth of the encoded data stream into each memory location. For these devices, the equivalent of the channel modulator and channel demodulator—the circuitry or algorithm that manages the mapping between encoded data bits and stored symbols, as well as the corresponding mapping between the stored symbols and the bits read out received data stream r[i] is part of the memory controller, responsible from reading and possibly writing the memory device.

A person knowledgeable in the art will understand that error correction codes and channel modulation schemes are designed with the error characteristics of specific channels in mind and that there are a wide variety of code types to choose from for designing any particular memory or communication system. These error correction codes generally do not reduce the probability of error in the corrected data stream w to zero. Instead they merely reduce that probability substantially, to a level below some subjectively acceptable error rate.

FIG. 4 shows a probability transition diagram of a binary symmetric channel, as described in reference to FIG. 2 above. Binary symmetric channels pass the bits of the encoded data stream v[i] through the channel to the channel decoder as the bits of the received data stream r[i]. The probability in any bit position that an error is introduced, i.e. that r[i] is different from v[i], is p, and so the probability that the bit is passed through uncorrupted by the channel is 1-p. The channel is symmetric in that the probability of an error is the same regardless of whether the encoded data bit is a zero or a one.

Much of information and coding theory is built on the assumptions inherent in the binary symmetric channel model. But in reality, many communications channels and memory devices are either non-binary or not symmetric with respect to their error properties. In practice, many of the phenomena that cause an error to be injected into the received data stream r preferentially operate on the different symbols in the channel. For example, if the characteristics of a binary channel are such that one symbol is always passed error free, while the other symbol is changed to be the first with probability p, then the channel is referred to as a Z-channel. FIG. 5 shows the probability transition diagram for such a channel in which a zero is always passed unchanged, while a one is changed to a zero with probability p. Error probability transition diagrams in which not all errors are possible (such as in FIG. 5, in which an error from a 0 to a 1 is not possible or sufficiently improbable to be discounted from consideration) are called incomplete. Channels and memories with error injection mechanisms that only produce some types of error transitions but not others are similarly referred to as incomplete.

FIG. 6 shows the probability transition diagram for another incomplete channel. In this case, the channel is capable of sending one symbol at a time chosen from a symbol set consisting of three symbols. The physical or electrical properties used to convey these three symbols is not relevant to the abstract analysis of the error characteristics of the channel, so the symbols are simply labeled a, b and c. These symbols may be represented by different voltages, currents, charge, or phases among others. For example, symbol a might be represented by a positive voltage, symbol c by a negative voltage, and symbol b by a voltage close to ground. For this illustrative channel, symbol b is passed through the channel always unchanged, while symbols a and c are changed to symbol b with probability p and q, respectively. In this case, since this is a ternary channel, symbols input into the channel input are the items in the transmitted symbol stream v' [j] and the symbols leaving the channel are the items in the received symbol stream r' [j]. A channel that is characterized by a probability transition diagram like that shown in FIG. 6, in that the symbol set size is more than two and at least one possible error transition has a probability that is effectively zero, is called a non-binary incomplete channel. This channel is also asymmetrical in that not all conceivable errors have the same probability of occurring.

The ability to detect and correct errors in a transmitted signal can be characterized in terms of the Hamming distance of the code that is used. The Hamming distance between any two code words (sometimes called the "distance") is the number of symbol positions in which the two code words are different. For example, the two binary code words 0011010 and 0010110 have Hamming distance 2 because they differ in two places. Similarly, the code words abacdda and acdadda have Hamming distance three in that they differ in three symbol positions. It is well understood that for a code for use on a complete channel (all errors between every pair of symbols in the symbol set are possible) to be able to correct t errors and detect t+1 errors, then the minimum separation of all code words has to be at least 2t+2. In particular the well recognized single error correcting, double error detecting (SECDED) binary Hamming codes have a minimum separation of 4 between all code words. All received words that are Hamming distance 1 from a code word are assumed to have a single error in them and therefore all such received data words can be corrected to that code word by the receiver. Any received data word that has a Hamming distance of 2 from more than one code word is assumed to have two errors in it. Since the Hamming distance from the received code word to two distinct valid code words is identical, the receiver cannot unambiguously determine which of the two code words was sent by the channel modulator. Under this circumstance, two errors are detectable but not correctable.

SUMMARY OF THE INVENTION

An object of the present invention is to provide an error detecting and/or correcting code and channel modulation for a symbol stream passing through a non-binary incomplete channel.

Another object of the present invention is to provide a code for error detection and/or correction in memory devices having a non-binary incomplete channel.

Another object of the present invention is to provide a code for error detection and/or correction in multi-valued memories that have incomplete error transition properties.

Another object of the present invention is to provide an efficient error-correcting code for non-binary incomplete channels and memories.

The present invention provides a method and a system for detecting and correcting errors occurring in non-binary incomplete communications channels or a comparable multi-valued memory device.

Another object of the present invention is to provide an algorithm for finding codes for use with incomplete communications channels or a comparable multi-valued memory device.

According to one aspect, a channel has a first and a second end. The first end of the channel is coupled to a transmitter. The channel is capable of transmitting symbols selected from a symbol set from the first end to the second end. The channel exhibits incomplete error introduction properties. A code includes a set of code words. The elements of the set of code words are one or more code symbols long. The code symbols are members of the symbol set. The minimum modified Hamming separation between the elements of the set of code words in light of the error introduction properties of the channel is greater than the minimum Hamming distance between the elements of the set of code words. A memory device, a method of using the channel, and a method of generating the code are also described.

In a further aspect, the code further includes a set of data words. The size of the set of data words is the same as the size of the set of code words. A one-to-one mapping exists between the elements of the set of data words and the elements of the code words.

In a further aspect, the size of the symbol set is at least 3.
In a further aspect, the size of the symbol set is at least 4.
In a further aspect, a receiver is coupled to the second end of the channel. The receiver has a channel demodulator and a channel decoder. The transmitter has a channel modulator and a source data encoder. The first end of the channel is coupled to the transmitter. The channel is a communications channel. The transmitter implements the code by receiving data words and generating code words. The receiver implements the code by receiving groups of symbols from the channel and generating data words that correspond to data words received by the transmitter.

In a further aspect, the size of the symbol set is at least 3.
In a further aspect, the size of the symbol set is at least 4.
In a further aspect, the minimum modified Hamming distance among the elements of the set of code words is 4 or more.
In a further aspect, the minimum modified Hamming distance among the elements of the set of code words is 5 or more.

In an additional aspect, a system includes at least one memory device including a plurality of memory cells. Each memory cell has a plurality of storage states in a one-to-one correspondence with the members of a set of stored symbols. The memory device has an error mechanism having incomplete error introduction properties. A memory controller is coupled to the at least one memory device to cause data derived from symbols selected from the set of stored symbols to be read out of a plurality of memory cells of the at least one memory device. A channel decoder is coupled to the memory controller to correct errors in the data read out of the at least one memory device, the errors having been introduced at least in part by the error mechanism. The channel decoder decodes a code including a set of code words. The minimum modified Hamming separation among the elements of the set of code words in light of the incomplete error introduction properties of the at least one memory device is greater than the minimum Hamming distance among the elements of the set of code words.

In a further aspect, the size of the symbol set is at least 3.
In a further aspect, the size of the symbol set is at least 4.
In a further aspect, a channel encoder is configured to receive un-encoded data and to encode the data into collections of code words selected from the set of code words. The code words are subsequently written into the plurality of memory cells in the at least one memory device.

In a further aspect, the minimum modified Hamming distance among the elements of the set of code words is 4 or more.
In a further aspect, the minimum modified Hamming distance among the elements of the set of code words is 5 or more.

In an additional aspect, a semiconductor memory device has a plurality of memory cells. Each memory cell has a plurality of storage states in a one-to-one correspondence with the members of a set of stored symbols. The memory device has an error mechanism having incomplete error introduction properties. A channel decoder is coupled to the memory cells to correct errors in the data read out of the memory cells, the errors having been introduced at least in part by the error mechanism. The channel decoder decodes a code including a set of code words. The minimum modified Hamming separation among the elements of the set of code words in light of the incomplete error introduction properties of the memory cells is greater than the minimum Hamming distance among the elements of the set of code words.

In a further aspect, the size of the symbol set is at least 3.
In a further aspect, the size of the symbol set is at least 4.
In a further aspect, a channel encoder is configured to receive un-encoded data and to encode the data into collections of code words selected from the set of code words. The code words are subsequently written into the plurality of memory cells.

In a further aspect, the size of the symbol set is at least 3.
In a further aspect, the size of the symbol set is at least 4.

In a further aspect, the minimum modified Hamming distance among the elements of the set of code words is 4 or more.

In a further aspect, the minimum modified Hamming distance among the elements of the set of code words is 5 or more.

In an additional aspect, a method of operating a channel having a first end, a second end, and an error injection mechanism with an incomplete error property includes the steps of:

receiving a symbol stream from the channel, the received symbol stream including a plurality of symbol words each symbol word including one or more symbols selected from a symbol set; and decoding the received symbol words to produce either a corrected data stream, according to an error correcting and/or detecting code, the code including a set of code words with a minimum modified Hamming distance of the code, the minimum modified Hamming separation being computed according to the error injection properties of the error injection mechanism of the channel, the minimum modified Hamming distance being greater than the minimum of the Hamming distances of the code, wherein the decoding of a symbol word includes determining which code word of the set of code words yields the smallest modified Hamming distance, and outputting the code word.

In a further aspect, the method further includes the steps of:

encoding un-encoded data by transforming un-encoded data words into code words according to a one-to-one mapping between data words and code words, wherein the code further includes the mapping, the encoding performed by a transmitter coupled to the first end of the channel; and transmitting the code words over the channel subject to the introduction of errors according to the error injection mechanism.

In a further aspect, the size of the symbol set is at least 3.

In a further aspect, the minimum modified Hamming distance is at least 4. The Hamming distance is less than 4.

Other objects and advantages of the present invention will become apparent from the included figures and the description below.

DEFINITIONS OF TERMS

The following terms are typically used in the description of the present invention:

The term x is used to denote the source data stream. This is typically, but not necessarily, a binary bit stream.

The term u is used to denote the compressed data stream. This is typically, but not necessarily, a binary bit stream.

The term v is used to denote the encoded data stream. This is typically, but not necessarily, a binary bit stream.

The term v' is used to denote the transmitted symbol stream. This is typically a symbol stream. Each symbol may be represented by a single electrical or physical entity or characteristic, or each symbol may by consist of a collection of smaller symbols, for example a collection of binary bits. At one extreme, each symbol is a binary bit; at the other extreme, each symbol may encode a great many bits of the original source data stream.

The term r' is used to denote the received symbol stream, which is the transmitted symbol stream after the injection of errors by an imperfect channel and/or memory.

The term r is used to denote the received data stream after demodulation. It is typically, but not necessarily, a binary bit stream.

The term w is used to denote the corrected data stream as output by the channel or ECC decoder. It is typically, but not necessarily, a binary bit stream.

The symbol x' is used to denote the final received data stream. It is typically, but not necessarily, a binary bit stream.

The symbol S is used to denote the set of symbols that a channel naturally communicates. For a binary channel, the symbol set S consists of the symbols 0 and 1. The variable l is used to refer to the size of (or number of elements in) the symbol set. The term "symbol" means a representation of the value of a single bit of source or code data. The size of a symbol set is the number of different values a single symbol may have. The size of a binary symbol set is 2, because two values (zero or one) are permitted for each symbol.

The term n is used to denote the size of the code word in symbols or bits. The term "code word" means a sequence of code symbols of a predetermined length, assigned to represent one or more data words and optionally containing error detection or correction information.

The term k is used to denote the size of a data word. The data word is the collection of bits or symbols that are encoded together into channel symbols or stored bits. The term "data word" means a sequence of symbols of a predetermined length, representing one or more bits of source data.

The terms p and q and used to denote the probability of an error being introduced at an arbitrary symbol position within the transmitted or stored symbol stream.

The term "symbol n-tuple" (e.g. "symbol triple") means a sequence of n symbols of either data or code, irrespective of whether the sequence corresponds to one or more bits of source data.

The efficiency of a code is measured as the ratio of the size of the data word k divided by the size of the code word n. In other words, the efficiency of a code is the ratio of the number of bits of encoded data that are needed to transmit or store a given number of unencoded data bits to that number of unencoded data bits. If either the data set or the transmitted symbol set are non-binary, the corresponding n or k is multiplied by its symbol set size. In the case of the encoded data, the symbol set size is denoted as "l". So, if the data word is binary and the transmitted (or stored) symbol stream is non-binary, then the efficiency of the code is computed as $k/n*l$.

The term "data stream" or "symbol stream" is used to represent all manner of communication or storage mechanism from a pure single bit wide serial stream to a multi-bit parallel organization in which many symbols are communicated or stored simultaneously or in parallel. Further, in the case of a channel that includes one or more memory devices, there is not necessarily an association between the sequence in which the encoded symbol stream is written to the memory into particular addresses in any arbitrary order, and the sequence in which information is read from those addresses to form the received data or symbol stream. Further it will be understood that the depiction of the memory device 303 as block with an input and an output is not intended to limit in any way the applicability of the present invention to multi-port memories. Embodiments of the present invention are applicable to channels and memories or all widths and organizations that exhibit asymmetrical error injection characteristics and/or non-binary channels or memories that store more than one binary bit of information per storage cell or location. In particular, the present invention is expressly applicable to memory systems of traditional organization with shared data address and/or control signal paths and common or shared controller circuitry for the writing and the reading of data to and from the memory devices within the memory systems, regardless of whether the data encoding and decoding is located within the memory or memories or within the memory controller or elsewhere in the system.

For the purposes of the present application, the term "modified Hamming distance" is intended to mean, in relation to a pair of code words, the minimum number of allowed errors needed to traverse a specific possible symbol transition diagram—such as, for example, that shown in FIG. 11—to migrate from the first code word to the second code word. The modified Hamming distance differs from the conventional Hamming distance in that only differences corresponding to allowed error transitions are considered. In other words, the modified Hamming distance is the smallest number of possible errors that can transform the first word to the second word. It should be understood that the modified Hamming distance is not necessarily symmetric in an incomplete channel. Referring to FIG. 11, the modified Hamming distance from aaa to bbb is 3, because aaa can be transformed to bbb for example via the three error transitions aaa→aab, followed by aab→abb and by abb→bbb. However, the modified Hamming distance from bbb to aaa is infinite, because no combination of error transitions can transform bbb to aaa. In contrast, the traditional Hamming distance is symmetric and the Hamming distance between aaa and bbb is 3 regardless of the symbol transition diagram, because aaa and bbb differ in three symbol positions.

The "modified Hamming separation" between a pair of code words is the minimum total number of allowed or possible errors required for both code words to be transformed to a third word, which may be either of the two code words or any other word. For example, referring to FIG. 11, the modified Hamming separation between the words abb and bba is 2, because the two allowed error transitions abb→bbb and bba→bbb result in both words being transformed to the common word bbb. Similarly, the modified Hamming separation between the words aaa and abb is two, because aaa can be transformed to abb in two allowed error transitions as shown above. The definition of the modified Hamming separation is additionally described below.

The "modified Hamming code word spacing" of an entire code is the minimum modified Hamming separation between any pair of code words in the code.

In the case of a channel or memory with incomplete error characteristics, it is possible for the modified Hamming distance between two code words to be greater than the conventional Hamming distance between the same two code words, for example if one code word cannot be expressed as the result of another code word plus one or more error transitions. For example, referring to FIG. 11, the triples aaa and cca have a Hamming distance of 2 because they differ in two symbol positions. The same two triples aaa and cca have a modified Hamming separation of 4 because both triples can be transformed to the common triple bba via two error transitions each (four total), e.g. aaa→baa→bba, and cca→bca→bba.

BRIEF DESCRIPTION OF THE DRAWINGS

The present invention is illustrated by way of example and not by way of limitation, in the figures of the accompanying drawings:

FIG. 7 shows the error transitions possible for a single symbol sent over a symmetrical ternary channel;

FIG. 8 shows the error transitions possible for a single symbol sent over an incomplete ternary channel;

FIG. 9 shows the error transitions possible for a single symbol sent over the incomplete ternary channel with error transitions depicted in FIG. 6;

FIG. 10 shows the error transitions possible for a pair of symbols sent over the incomplete ternary channel with error transitions depicted in FIG. 6;

FIG. 11 shows the error transitions possible for three symbol words sent over the incomplete ternary channel with error transitions depicted in FIG. 6;

FIG. 12 shows a data eye for a symbol being sent on a channel configured to send one of three symbols every symbol time period;

FIG. 13 shows a prior art DRAM memory cell;

FIG. 14 shows an allocation of three symbols to three voltage ranges of the cell voltage in a DRAM storage cell;

FIG. 15 shows the probability transition diagram for a ternary DRAM memory cell with $V_{cell}$ shorted to $V_{plate}$.

FIG. 16 shows an allocation of four symbols to four voltage ranges of the cell voltage in a DRAM storage cell and four possible assignments of source data bit pairs to the symbols;

FIG. 17 shows the transition probability diagram for a channel capable of storing or transmitting four symbols, and in which the error transition probabilities are data dependent.

DETAILED DESCRIPTION

Block codes are a group of error correcting codes that protect groups of k symbols of source data stream u by adding symbols of redundancy to form code words that are n symbols long. The groups of k symbols from the source data stream are data words. If the data symbols and the coded symbols are chosen from the same symbol set, the number of redundant symbols essentially providing error protection (detection and/or correction) is n–k. Binary block codes are applied to binary source data streams dividing up the source data stream logically, temporally, or physically into k-bit data words. Each data word is encoded into an n bit code word which is sent to the channel modulator for encoding into m symbols, creating an m-symbol long transmitted code word. In the case of a binary channel and a binary source data stream, m=n. Alternatively, it is understood that the error coding and the modulation (division of groups of bits into symbols) can be done simultaneously, as a single step.

A code may be selected such that a subset of n-tuples form a set of code words that correspond in a one-to-one relationship with the set of all possible data words, and the remaining code n-tuples do not correspond to data words, i.e. they are not part of the code. In the situation, when one of n-tuples that are not part of the code is received by the channel demodulator or channel decoder or ECC decoder, this condition is indicative of one or more errors having been introduced by the channel or memory. This process will be described below in further detail.

Figure 5:
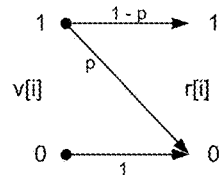
FIG. 5 shows a transition probability diagram for a binary channel with asymmetrical and incomplete error transition probabilities. This type of figure is interchangeably called an error transition diagram or a symbol transition diagram.

FIG. 7 shows the possible error transitions for a symmetrical and complete ternary channel. This style of graph shows the same information as that of, for example, FIG. 5, except that the sent symbols and received symbols are superimposed on each other in the figure. The represented channel is complete since each symbol can be erroneously changed into any other symbol within the channel or memory, as indicated by the bidirectional arrows. Each bidirectional arrow represents two possible errors that can be injected into the transmitted symbol stream. FIG. 8 shows the possible symbol transformation graph for another, incomplete ternary channel. In this case symbol a can degrade into symbols b or c, and symbol b can degrade into symbol c, but none of the other conceivable error transformations are physically possible. This symbol transformation graph would be possible for channels, for example, in which signal levels or stored values degrade over time or along the length of the channel, toward a lowest possible value represented by the symbol "c".

Figure 6:
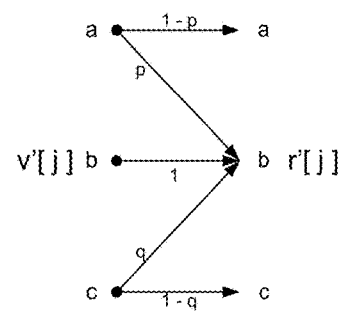
FIG. 6 shows a transition probability diagram for a ternary channel capable of storing or transmitting three symbols, and in which the error transition probabilities are asymmetrical and the graph is incomplete.

Examples of codes will be described below for achieving single error correcting, double error detecting codes and single error correcting, single error detecting codes for use with a ternary incomplete channel. It should be understood that other types of error detection and correction can be implemented in a similar manner, and could be generalized to q-ary channels where q>2. A ternary channel is one in which the size of the transmitted symbol set is 3, as illustrated in FIG. 6. FIG. 9 shows the complete set of three values of one symbol. One possible code includes only the symbols a and c, as indicated by the shaded grey boxes around some symbols. If symbol b is received, then an error occurred but the original transmitted symbol cannot be identified, as given this channel's possible error transitions, symbol b is modified Hamming distance 1 from both symbol a and symbol c. In an embodiment of the present invention, FIG. 10 shows a code constructed of pairs of symbols sent on the ternary channel with the error characteristics of FIG. 6. There are nine possible symbol pairs. If symbol pairs aa and cc are chosen as code words to represent the two binary values (zero or one) of a source data bit, then all possible single errors can be corrected and all possible double errors can be detected. This code is illustrated in Table A.

TABLE A

| Source Data | Transmitted Code Word | Received Code Word | Comment | Destination Data |
|---|---|---|---|---|
| 0 | aa | aa | No errors | 0 |
|  |  | ab | Single error | 0 |
|  |  | ac | Not possible | NA |
|  |  | ba | Single error | 0 |
|  |  | bb | Double error | Error indication |
|  |  | bc | Single error | 1 |
|  |  | ca | Not possible | NA |
|  |  | cb | single error | 1 |
| 1 | cc | cc | No errors | 1 |

It should be understood that the mapping of the source data bit onto the code words is completely arbitrary and that either of the two assignments of source data bit values (0 and 1) onto code words (aa and cc) would yield the same net effect.

It should also be understood that the received code words listed as "not possible" in the comment field of Table A represent a received code word that is not contemplated by the error transition chart of FIG. 9 based on error transitions from any possible code word. In certain circumstances, there may be other error mechanisms, of presumably low probability, other than those embodied in the error transition diagram. Typically such error mechanisms would be much less probable than the primary error mechanism protected for. Error mechanisms that produce error transitions that are not evident in the error transition diagram underlying a code may not be correctable by that code. Under such circumstances, the received code words listed as not possible would be considered an uncorrectable error. In addition, there would also possibly be other error mechanisms which singly or in combination with other error mechanisms, can change one code word to another; these errors or error combinations fall into the class of undetectable errors.

If symbol pair bb is also a code word, then the code would then be a single-error detecting, single-error correcting code with three valid code words. Each symbol pair would be only able to transmit a single bit of the source data, however, collections of symbol pairs could be combined to encode larger number of source data bits. Table B shows that grouping two pairs of symbols together creates a code that can transmit three bits of source data and is able to detect and correct a single error in each of the pairs of symbols.

TABLE B

| Source Data | Transmitted Code Words |
|---|---|
| 000 | aa aa |
| 001 | aa bb |
| 010 | aa cc |
| 011 | bb aa |
| Not Used | bb bb |
| 100 | bb cc |
| 101 | cc aa |
| 110 | cc bb |
| 111 | cc cc |

In this modulation of three source bits onto two pairs of symbols, there are 8 source bit combinations and 9 nine valid code word combinations. One of the code word combinations is left unused. It should be understood that the particular modulation of source data bit triples onto symbol pair pairs is arbitrary and can be selected according to other considerations. It should also be understood that this pattern of grouping more symbol pairs together will create additional higher-order codes able to detect and correct a single error in each symbol pair that can encode greater numbers of source bits and improve the efficiency of the code. The characteristics of an exemplary few of these codes are given in Table C. It should be understood that the modulation of source data bit values onto symbol pair values is arbitrary and that the corresponding modulator and demodulator could be designed using traditional logic minimization techniques. It should also be understood that the individual symbols that are part of the symbol pairs could be separated in time or space by interleaving or otherwise shuffling or reordering the symbols so that the error pairs that would not be detectable with this class of codes would not be logically, physically, or temporally adjacent, thereby reducing the probability that multiple errors would occur in the same symbol pair.

TABLE C

| Number of Symbol Pairs | Number of Symbols | Number of Code Word Combinations | Possible Number of Source Data Bits |
|---|---|---|---|
| 2 | 4 | 9 | 3 |
| 3 | 6 | 27 | 4 |
| 4 | 8 | 81 | 6 |
| 5 | 10 | 243 | 7 |
| 6 | 12 | 729 | 9 |
| 7 | 14 | 2187 | 11 |
| 8 | 16 | 6561 | 12 |
| 9 | 18 | 19683 | 14 |
| 10 | 20 | 59049 | 15 |
| 11 | 22 | 177147 | 17 |
| 12 | 24 | 531441 | 19 |

FIG. 11 shows all the possible error transitions given a ternary channel defined by FIG. 6 for code words consisting of three symbols. In this case, a code consisting of five code words can permit correction of all single errors and detection of all double errors within the three symbols, as illustrated in Table D.

Referring to Table D, for example, note that received symbol triple bab is two errors away from both code words aaa and cac. Specifically, code word aaa could be transformed by a first error (a→b) into baa, which could be transformed into another instance of the same error type, this time in the third symbol, into bab. Similarly, the code word cac can be transformed into the non-code word bab by a c→b error occurring in both the first and third symbol positions.

More importantly, since the transition from symbol b to symbol a is not possible according to channel characteristics defined by FIG. 6, the modified Hamming distance from code word bbb to symbol triple bab is effectively infinite because there is no error contemplated by the incomplete error transition diagram of FIG. 6 that can transform the second b symbol into an a symbol. Referring to the same example as above, according to the symbol transition diagram of FIG. 11, the modified Hamming distance from symbol triple bab to symbol triple bbb is one because a single allowed error can transform the middle symbol from an a into a b, thereby transforming the triple from bab into the triple bbb. Similarly, the modified Hamming distance from symbol triple bbb to symbol triple bab is infinite, the modified Hamming distance from aaa to abb is two, and the modified Hamming distance from acc to abb is two.

TABLE D

| Transmitted Code Word | Received Code Word | Error type | Corrected Code Word |
|---|---|---|---|
| aaa | aaa | No errors | aaa |
|  | aab | Single error | aaa |
|  | aac | Not possible | NA |
|  | aba | Single error | aaa |
|  | abb | Double error | Error indication |
|  | abc | Single error | acc |
|  | aca | Not possible | NA |
|  | acb | Single error | acc |
| acc | acc | Single error | acc |
|  | baa | Single error | aaa |
|  | bab | Double error | Error indication |
|  | bac | Single error | cac |
|  | bba | Double error | Error indication |
| bbb | bbb | No errors | bbb |
|  | bbc | Double error | Error indication |
|  | bca | Single error | cca |
|  | bcb | Double error | Error indication |
|  | bcc | Not Possible | NA |
|  | caa | Not possible | NA |
|  | cab | Single error | cac |

TABLE D-continued

| Transmitted Code Word | Received Code Word | Error type | Corrected Code Word |
|---|---|---|---|
| cac | cac | No errors | cac |
|  | cba | Single error | cca |
|  | cbb | Double error | Error indication |
|  | cbc | Single error | cac |
| cca | cca | No errors | cca |
|  | ccb | Single error | cca |
|  | ccc | Not possible | NA |

For the purposes of understanding the error detecting and correction properties of this code, an aggregate property is considered. In the above example, since the modified Hamming distance from aaa to abb is two, and the modified Hamming distance from acc to abb is also two, the modified Hamming separation between code words aaa and acc through non-code word abb is the sum of these two values or 4. In comparison, the conventional Hamming distance of the code cannot exceed 3, because each word contains only 3 symbols and therefore two words can differ in at most three positions.

An important difference between the conventional Hamming distance and the modified Hamming distance is that in calculating the modified Hamming distance, two errors in a single symbol position can result in a distance of two. For example, in the case of a channel or memory with an incomplete set of error transitions depicted in FIG. 17, the symbol triples caa and bba are both distance two from the symbol triple aaa even though the former only includes errors in the first symbol. The two errors in this case (a→b) and (b→c) are both allowed and could, within the definition of this channel, occur sequentially to the same symbol position. In another embodiment, a different channel or memory with the same error transition diagram would be capable of injecting at most one error into each symbol transmitted or stored, or alternatively, the probability of a second error being injected into a symbol is substantially less than the probability of a second error being introduced into another symbol such that the former class of events can be ignored.

The modified Hamming separation plays an important role in understanding the degree of error detection and correction provided by a code in light of the specific symbol transition diagram. It should be understood from the above example that a code can provide single error correction and double error detection over a channel with incomplete error injection characteristics even if the conventional requirement that the code words have a Hamming distance of 4 is not met.

For example, if every code word has a modified Hamming separation of at least three from every other code word, a double error in the first code word is distinguishable from an error free transmission of any other code word. In addition, if all other possible received words that are not code words but which have a modified Hamming distance of 1 from a code word have at least a modified Hamming distance of 3 from all other code words, all possible single errors are unambiguously correctable and distinguishable from all other single and double errors. Finally, if all possible received words that are distance two from a code word also have a modified Hamming distance of at least two from all other code words, all double errors are detectable as double errors, even if they are not all necessarily correctable. Such a double error would not be correctable if the received word is a modified Hamming distance of two from at least 2 code words.

The modified Hamming separation between two code words is thus the related to the ability to differentiate code words with injected errors in the same way that the traditional Hamming distance is for codes operating in an environment with complete error characteristics. In particular, the modified Hamming separation between two code words is equal to the minimum of the sum of the modified Hamming distance from the first code word to any non-code word, and the modified Hamming distance from the second code word to any that same non-code word, with that minimum being taken over all possible non-code words.

When expressed algebraically, the modified Hamming separation from between two code words a and b both n-tuples selected from the space of possible n-tuples $S^n$ is given by $$mHs(a,b)=\min(mHd(a,c)+mHd(b,c)) \text{ overall } c \in S^n, c \neq a, c \neq b$$

where mHs(a, b) is the modified Hamming separation between code word a and code word b, and mHd(a, b) is the modified Hamming distance from code word a to code words b.

The modified Hamming separation function is symmetric in that mHs(a, b)=mHs(b, a).

The modified Hamming code word spacing of an entire code is the minimum of the modified Hamming separation between each pair of code words in the code. The modified Hamming code word distance of an entire code is the minimum of the modified Hamming distance between each pair of code words in the code. Algebraically, these are given by $$mHcws(C)=\min(mHs(a,b)) \text{ overall } a,b \in C, C \subseteq S^n, a \neq b$$

$$mHcwd(C)=\min(mHd(a,b)) \text{ overall } a,b \in C, C \subseteq S^n, a \neq b$$

where C is a code consisting of a set of n-tuples in $S^n$.

If the modified Hamming code word spacing of a code is four, then all non-code words are either 1) one error away from one code word and at least three errors away from all other code words, 2) two errors away from one code word and more than two errors away from all other code words, 3) two errors away from two or more code words, or 4) more than two errors away from all code words. If, in addition, each of the code words is at least modified Hamming distance of 3 away from all other code words, then if a received word is a code word it cannot be the result of a different code word with either one or two errors injected into it.

A code is therefore a single error correcting, double error detecting (SECDED) code over a channel or memory with incomplete error injection characteristics if $$mHcws(C) \geq 4 \text{ and}$$

$$mHcwd(C) \geq 3$$

If all these conditions are satisfied then all received code words can be assumed to be the result of error free transmission and/or storage. All received non-code words in the first category above can be safely assumed to be the result of a single error and the transmitted or stored code words can be unambiguously determined to correct the error. All received non-code words in the second category can similarly be concluded to be the result of an unambiguously correctible double error. All received non-code words in the third category are the result of a double error, but the original transmitted or stored code word cannot be unambiguously determined. All received non-code words in the fourth category can be treated as an uncorrectable multiple error, even though some may be the result of a correctable multiple error.

Table E charts the relationship between the degree of error correction and detection provided by the code and the minimum modified Hamming code word separation and the minimum modified Hamming code word distance of the code, according to the same logic as applied above. It should be understood by one of skill in the art how to extend Table E to higher degrees of error correction and detection according to the disclosed reasoning.

TABLE E

| Number of Correctible Errors | Number of Detectable Errors | Minimum modified Hamming code word spacing of the code | Minimum modified Hamming code word distance of the code |
|---|---|---|---|
| 0 | 0 | 1 | 1 |
| 0 | 1 | 2 | 2 |
| 1 | 1 | 3 | 2 |
| 1 | 2 | 4 | 3 |
| 2 | 2 | 5 | 3 |

As a result of the incompleteness of the error transition diagram, the modified Hamming separation between two code words can be larger than the conventional Hamming distance, i.e. the sum of the number of symbol positions in which two code words differ. In the previous example from Table D, the Hamming distance between aaa and acc is 2 because two of the three symbols differ. These two code words could not be part of a conventional single error correcting code because they lack the required Hamming separation of 3.

A code can be single error correcting and double error detecting if the code has a modified Hamming code word spacing of at least 4. If, for example, a non-code word is modified Hamming distance 1 away from a first code word and modified Hamming distance 2 away from a second code word (i.e. the modified Hamming separation of the code is at most 3), the channel decoder would be unable to distinguish between the single symbol error associated with the first code word and the double symbol error associated with the second code word. Just as the modified Hamming distance between two code words can be greater than their conventional Hamming distance, so too can the modified Hamming code word spacing of a code be greater than its conventional Hamming distance (i.e. the minimum of the Hamming distance between every pair of code words). A code can therefore be error correcting and/or detecting to a degree that would not be possible if the error transition diagram were complete or if the code failed to take advantage of the incomplete error characteristics.

The example of Table D is a code that is single error correcting double error detecting in the presence of an incomplete error transition diagram because its modified Hamming code word spacing is 4 or greater, and its modified Hamming code word distance is 3 or greater, even though its Hamming distance is less than 4. Because of this the code of Table D would not be considered a SECDED code based on its conventional Hamming distance. Additional examples will be given of codes that have a modified Hamming code word spacing greater than their Hamming distance when a specific error transition diagram is considered, such that the code is capable of detecting or correcting a greater number of errors than would be understood from consideration of the Hamming distance alone.

Referring still to Table D, note that if symbol triple bbb is excluded from the set of code words, then in all cases the receipt of the symbol b is indicative of an error. In this case, the physical channel properties—such as, for example, voltage or current or charge levels—could be assigned the appropriate symbols a, b, c such that the probability of a transition from a to c or vice versa were dramatically smaller than the probabilities of the allowed error transitions from symbols a and c to symbol b. One such example is a channel combined with modulator/demodulator designed to ensure that some symbol transitions are much less likely than other symbol transitions, the distinction becoming the difference between essentially impossible transitions and error transitions having a non-zero probability.

As with the combining of symbol pairs on this channel to create larger codes able to process larger numbers of source code bits simultaneously, multiple symbol triples can be combined to produce codes with a greater number of code words. Table F illustrates the same combinations of triples. It should be understood that any modulation or mapping between source data bits and multiple symbol triples can be used with the present embodiment.

TABLE F

| Number of Symbol Triples | Number of Symbols in the code word | Number of Code Word Combinations | Possible Number of Source Data Bits |
|---|---|---|---|
| 1 | 3 | 5 | 2 |
| 2 | 6 | 25 | 4 |
| 3 | 9 | 125 | 6 |
| 4 | 12 | 625 | 9 |
| 5 | 15 | 3125 | 11 |
| 6 | 18 | 15625 | 13 |
| 7 | 21 | 78125 | 16 |
| 8 | 24 | 390625 | 18 |
| 9 | 27 | 1953125 | 20 |

Larger groups of symbols can similarly be combined into code words. If the modified Hamming code word spacing of four or greater, then the code is a single error correcting, double error detecting code. One embodiment of the present invention is a SECDED code based on four symbol words on the ternary channel with error characteristics as depicted in FIG. 6. This code is illustrated in Table G. This code uses the middle symbol b in only one code word. This code word can be removed without changing the possibility of implementing modulations that map three source data bits to four symbols on the channel. Another embodiment of the present invention would include the same codes as shown in Table G, in which code word 5, being bbbb is not used. In this case, shown in the last column of Table G, as in a previous embodiment, none of the code words use symbol b. In this embodiment, receipt of symbol b can be used as an error indication, triggering additional analysis both to determine the nature of the error or errors and to correct any correctable errors. It should be understood that this example does not rely on any specific mapping of specific values of groups of source data bits onto specific code words.

TABLE G

| Index | Transmitted Code Word | Possible Source Data Stream Encoding |
|---|---|---|
| 1 | aaaa | 000 |
| 2 | aacc | 001 |
| 3 | acac | 010 |
| 4 | acca | 011 |
| 5 | bbbb | |
| 6 | caac | 100 |
| 7 | caca | 101 |
| 8 | ccaa | 110 |
| 9 | cccc | 111 |

In another embodiment, groups of 5 symbols on the same channel can be grouped into code words, and encoded according to the code listed in Table H. In this embodiment, as with the others of this class, the modified Hamming separation between each of the code words is at least 4, making this a SECDED code. It should be understood that other codes would be possible with different characteristics based on their modified Hamming code word spacing based on the error characteristics of the channel in question.

TABLE H

| Index | Transmitted Code Word | Possible Source Data Stream Encoding |
|---|---|---|
| 1 | aaaaa | 0000 |
| 2 | aaacc | 0001 |
| 3 | aacac | 0010 |
| 4 | aacca | 0011 |
| 5 | cacca | 0100 |
| 6 | acaca | 0101 |
| 7 | accaa | 0110 |
| 8 | acccc | 0111 |
| 9 | aabbb | |
| 10 | ababb | |
| 11 | abbab | |
| 12 | abbba | |
| 13 | caaaa | 1000 |
| 14 | caacc | 1001 |
| 15 | cacac | 1010 |
| 16 | cacca | 1011 |
| 17 | ccaac | 1100 |
| 18 | ccaca | 1101 |
| 19 | cccaa | 1110 |
| 20 | ccccc | 1111 |
| 21 | ccbbb | |
| 22 | cbcbb | |
| 23 | cbbcb | |
| 24 | cbbbc | |

It should be understood that this class of codes may alternatively use more than 5 symbols in each code word, and that the corresponding channel encoder, channel modulator, channel demodulator, and channel decoder can be implemented using known logic synthesis techniques, regardless of whether the channel is a communications channel or a memory device. It should also be understood that in the case that the channel is implemented as one or more memory devices, individual code words of any of the embodiments of the present invention can be stored wholly in a single memory device or spread across multiple memory devices. Table I illustrates the variety and effectiveness of the codes found according to the method of FIG. 18 assuming a channel having the characteristics defined by FIG. 6.

TABLE I

| Number of Symbols | Number of Code Word Combinations | Possible Number of Source Data Bits |
|---|---|---|
| 3 | 5 | 2 |
| 4 | 9 | 3 |
| 5 | 21 | 4 |
| 6 | 51 | 5 |
| 7 | 118 | 6 |
| 8 | 291 | 8 |
| 10 | 1842 | 10 |
| 12 | 12155 | 13 |

FIG. 12 shows an eye diagram of a ternary communications channel of an embodiment of the present invention. At the sample point $t_{sample}$, the voltage of the incoming signal is sampled i.e. captured. The figure illustrates the three voltage ranges $V_{cl}$-$V_{ch}$, $V_{bl}$-$V_{bh}$, and $V_{al}$-$V_{ah}$ which are reliably sampled as symbols c, b, and a, respectively. The width of the three voltage ranges and the noise margin between the voltage ranges for symbols a, b, and c as well as the characteristics of the receivers' input circuitry would determine the conditions under which a signal sent as one symbol would be received as another. For example, in one embodiment, the acceptable ranges for symbols a and c are reduced, while the range for symbol b is increased. These changed ranges are effected to decrease the probability that a symbol transmitted as a symbol a is received as a symbol c, and vice versa. As a result, the channel, with its transmitter and receiver pair, is assured to have asymmetric error characteristics, for instance as depicted in probability transition diagram of FIG. 6 or the modified Hamming distance graphs of FIGS. 9 through 11. In the present embodiment, the selected voltage ranges therefore facilitate the use of ternary codes that take advantage of the asymmetrical error characteristics. This may be advantageous even if the probabilities of an error transition from symbol a to symbol b, or from symbol c to symbol b, are increased.

Figure 1:
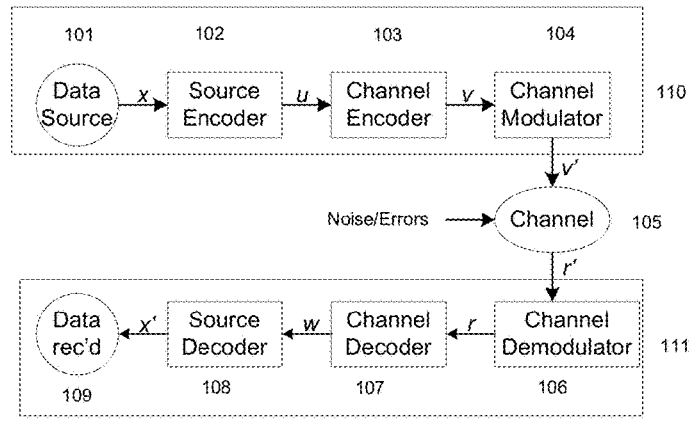
FIG. 1 is a representation of a first end-to-end communication system, to which aspects of the present invention can be applied.
Figure 2:
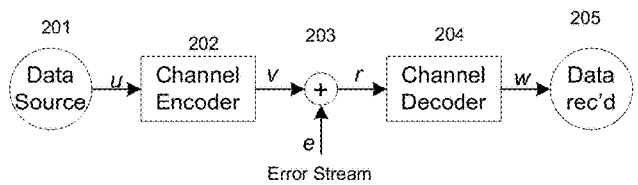
FIG. 2 is a representation of a second end-to-end communication system, to which aspects of the present invention can be applied.
Figure 3:
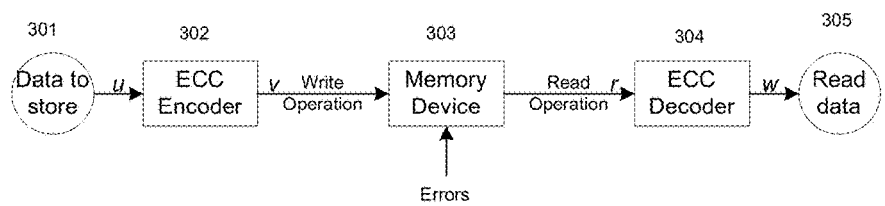
FIG. 3 is a representation of a memory system, to which aspects of the present invention can be applied.

Embodiments of the present invention may be used in systems of the general type illustrated in FIG. 1, FIG. 2 and FIG. 3. For example, in the case of communication system of the type illustrated in FIG. 1, the Channel Encoder and the Channel Modulator would embody a code of the present invention, such that the incomplete error characteristics of the channel were taken advantage of. The Channel Demodulator and the Channel Decoder would decode the code and detect and/or correct any errors introduced by the channel up to the error detection and correction limits of the code. In the case of a storage system as depicted in FIG. 3, the ECC Encoder would embody a code such that the incomplete error characteristics of the Memory Device were taken advantage of. The ECC Decoder would decode the read data and detect and/or correct any errors introduced by the memory up to the error detection and correction limits of the code.

Figure 4:
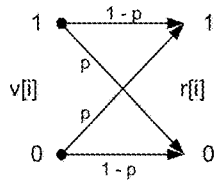
FIG. 4 shows a typical transition probability diagram for a binary symmetric channel.

FIG. 13 shows a schematic of a memory cell in a dynamic random access memory (DRAM). A DRAM includes a plurality of memory cells, each of which is typically used to store a single bit of information. Each bit of information is typically represented by a quantity of charge stored on the illustrated capacitor such that the $V_{cell}$ is greater than or less than $V_{plate}$. A significant characteristic of DRAMs is that the charge stored on the capacitor leaks away, so that $V_{cell}$ drifts toward $V_{plate}$. After a period of time, $V_{cell}$ becomes insufficiently different from $V_{plate}$ for the portion of the DRAM responsible for reading that bit of information to distinguish whether a one or a zero was originally stored there. This and other mechanisms known in the art can cause a written one to be read as a zero and vice versa. Thus, when considered as part of a channel, according to FIGS. 1 and 3, DRAMs have the traditional binary symmetric error characteristics as illustrated by the transition probability diagram of FIG. 4.

In one embodiment, the memory cell reading circuitry is adapted to interpret the cell voltages $V_{cell}$ within each of the memory cells as being indicative of one of three symbols, a, b, and c. DRAMs that store more than one bit of information per cell are known in the art. In this embodiment, illustrated in FIG. 14, cell voltages between $V_{al}$ and $V_{ah}$ at the time the cell is read are interpreted as symbol a, cell voltages between $V_{bl}$ and $V_{bh}$ are interpreted as symbol b, and cell voltages between $V_{cl}$ and $V_{ch}$ at the time the cell is read are interpreted as symbol c. These cell voltage ranges are selected such that $V_{plate}$ is within the range corresponding to symbol b, and the ranges corresponding to symbols a and c are respectively above and below $V_{plate}$. When the memory cell is written, if the cell is written with symbol a, $V_{cell}$ is set at an initial value as close to $V_{dd}$ as practical. Further, if the cell is to be written with symbol c, $V_{cell}$ is set at an initial value as close to Gnd as practical, and if the cell is to be written with symbol b, $V_{cell}$ is set at an initial value close to $V_{plate}$. As the charge on the capacitor leaks, and the voltage $V_{cell}$ degrades toward $V_{plate}$, symbols a and c become less distinct from symbol b, but not indistinct from each other. This error mechanism of DRAMs when operated as a ternary memory has an incomplete transition probability diagram. It is contemplated that this principle may be applied to other storage media or communications channels wherein one significant error mechanism results in any signal decaying toward a predetermined quantity or state. The signal ranges corresponding to the various symbols can be selected to produce an incomplete transition probability diagram and thereby produce an asymmetric channel, particularly when signal values above and below the predetermined quantity are available.

DRAMs have other error introduction mechanisms. Some produce soft errors that are one-time errors, while others involve defective memory cells that always fail in the same way. For example, a memory cell that includes a capacitor that fails in a way that causes $V_{cell}$ to be permanently shorted to $V_{plate}$ would present itself as a cell with the probability transition diagram shown in FIG. 15.

Other embodiments include a family of channels for use with memories or corresponding channels that store or communicate one of four values. DRAMs and other memory types that store four values per cell are known in the prior art. As depicted in FIG. 16, each of the four voltage ranges stored in an exemplary memory cell represents one of four symbols, here denoted as a, b, c, and d. In cases of a channel or memory where the size of the symbol set is a power of two, the channel modulation can be as straightforward as selecting an integral number of bits from the encoded data stream to determine the symbol to be stored or transmitted. FIG. 16 shows 4 possible channel modulations, with different encoded data stream bit pairs corresponding to each of the four stored or transmitted symbols. The first of these encodings, labeled I in FIG. 16, is depicted in the channel transition probability diagram depicted in FIG. 17. This diagram is characteristic of an error introduction mechanism caused by stored or transmitted voltages degrading toward the center point. In particular, symbols a and d will degrade toward symbols b and c respectively, while symbols b and c effectively degrade toward each other by approaching a common intermediate voltage. With this grey code encoding of the encoded channel bits to symbols, not all error transitions are possible. There are four possible errors per pair of encoded channel bits (11=>10; 10=>00; 00=>10; 01=>00). When these errors are viewed in terms of the individual bits it is evident that for the first bit of the pair, all errors are possible (1=>0 and 0=>1), however for the second bit of each pair, only one error transition is possible (1=>0). For this channel and using this channel modulation, the channel transition probability diagram for the first bit of each pair is that shown in FIG. 4, while the channel transition probability diagram for the second bit of each pair is that shown in FIG. 5. However, because the possible errors in the first and second bits of each pair are coupled (i.e. only one error in each pair is possible at once), decomposing the error transition graph of FIG. 17 into those of FIGS. 4 and 5 loses some information; codes based on FIG. 17 can be have higher information content or better error correction/detection than a binary code based on FIG. 4 for the odd bit positions and FIG. 5 for the even bit positions.

In the environment presented by the quaternary channel or memory represented by FIGS. 16 and 17, the channel encoding and channel modulation are conveniently dealt with together. For example here, a collection of k binary source data bits can be collected into data words and each data word can be encoded into a k bit code word. As long as, in this case, k is even, and the encoding takes into account the error characteristics of the channel/memory, then any desired error correction and detection characteristics of the code/channel combination can be obtained.

Figure 18:
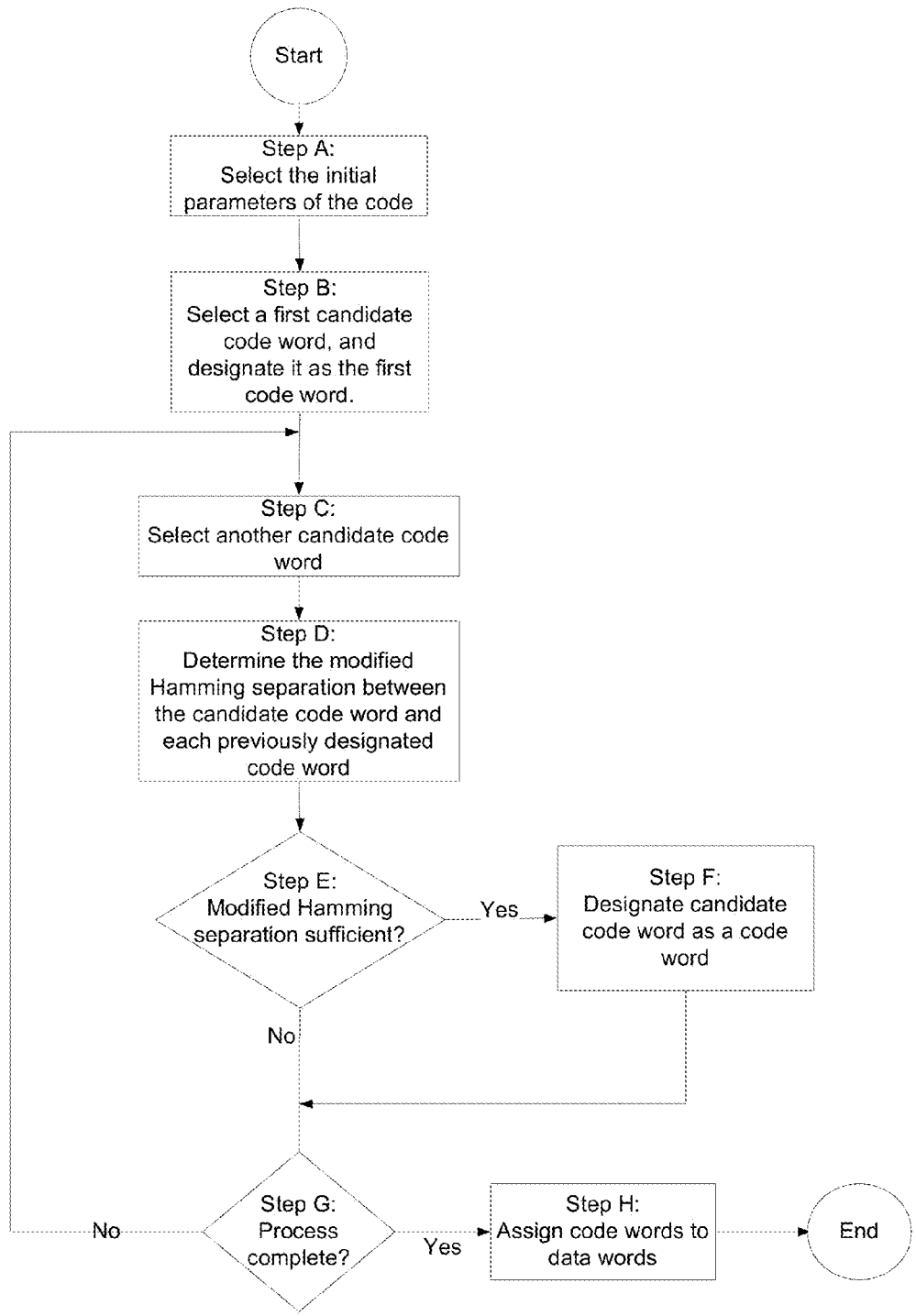
FIG. 18 illustrates an algorithm for indentifying codes for use with channels with asymmetrical error probabilities.

FIG. 18 presents a method for finding a code—that is, a correspondence between data words and code words—that meets a desired level of error correction performance based on the error injection characteristics of the channel/memory. The algorithm searches the code word space in order to find code words that have an adequate modified Hamming separation from each other, and then assigns those code words to data words. The algorithm begins at Step A, by determining the parameters of the code, for example: the size of the code word, the desired or target modified Hamming code word spacing and modified Hamming code word distance of the resulting code and the channel error transition characteristics for each bit position or group of bit positions within the code word. It should be understood that some of these characteristics may be determined by the characteristics of the channel/memory, the overall system error rate target, and the memory organization constraints. As such, they are inputs to this algorithm which finds a code subject to these parameters. Table E above may be used in Step A to quantify the desired error correction and detection characteristics as a target modified Hamming code word spacing.

In general, the larger the code word, the lower the overhead for achieving a predetermined level of error detection and correction, and the more efficient the resulting code. Further, the more incomplete the channel error transition characteristics for each symbol position, the greater likelihood that the incomplete characteristics can facilitate a code that is more efficient than a comparable conventional code that assumes a complete error transition diagram.

At step B, one of the possible code words is selected and designated as the first actual code word. The variable J is kept as a running count of the actual number of possible code words found that, as a group, all meet the minimum modified Hamming separation criteria from each other. This first code word can be selected randomly, or according to some insight into the error characteristics of the channel/memory, or simply as a simple known starting code word such as all zeros or all ones, or with a code word of a specified modified Hamming distance from all zeros or all ones, or some other criteria. The present invention is not limited to any particular method of selecting the first code word. The choice of the first code word will influence the set of the code words the algorithm of FIG. 18 will find. Some final sets of code words will be preferred over others in that some final sets of code words may have more code words than others, and some may be more readily implementable in hardware encoders or decoders than others. Whether one initial code word is preferred over another is a function of the error transition diagram of the channel, the implementation constraints and methods and the target level of error detection and correction.

Since the first code word is a variable in the final code design, the algorithm of FIG. 18 may be performed a plurality of times with different first code words and/or different candidate selection algorithms (step C) and selecting the most preferred of all the resulting codes according to simple criteria of code word set preference or according to an aggregation of a plurality of simple criteria of code word set preference. The present invention is not limited to any particular criteria or collections of criteria for selecting on collection of code words over another.

At step C, a new candidate code word is selected from those potential code words that have not yet been selected for consideration. As in step A, this can be done in any number of different ways. For example, the candidate code word for the current iteration of the inner loop can be selected randomly, incrementally from the last candidate code word, by selecting a candidate code word that is a small modified Hamming distance or separation from a selected code word or by some other method. For example, if the code words are considered a multi-digit integer, base 1 (the size of the symbol set), then an incremental method would be to choose $c_{i+1}=c_i+1$, where $c_i$ is the $i^{th}$ candidate code word. An alternative method is to, on subsequent executions of step C, select all candidate code words that are modified Hamming separation d from the first code word $w_1$, then select all candidate code words that are modified Hamming separation d from code word $w_2$, and so on until the list of designated code words $w_j$ has been exhausted. If there are still unselected candidate code words remaining when the list of designated code words has been exhausted, then all the remaining unselected candidate code words can be sequentially selected in step C by some other method, such as randomly or incrementally.

Another potential method consists of sequentially selecting all candidate code words in subsequent executions of step C is to first select all candidate code words that are modified Hamming separation 1 from the first code word, then selecting all candidates that are modified Hamming separation two from the first code word, followed by all candidates that are modified Hamming separation three from the first code word, and so on until all candidates have been selected. Other potential methods involve selecting candidate code words that facilitate an efficient or small implementation of the corresponding encoder or decoder. The order in which candidate code words are selected influences the resulting code and its ease of implementation, so that different implementation circumstances may call for different selection sequences or criteria. The present invention is not limited to any particular method of selecting the subsequent candidate code words.

Once a candidate code word $c_i$ has been selected at step C, the modified Hamming code word spacing and the modified Hamming code word distance of the potential code including candidate code word $c_i$ is determined at step D. This may be done by determining the modified Hamming separation between the candidate code word $c_i$ and all previously designated code words $w_j$, and comparing the result to the target modified Hamming code word spacing. Any alternative method of determining whether the modified Hamming code word spacing of the potential code including the candidate code word is going to be less than or greater or equal to the target modified Hamming code word spacing can be used. The determination of the modified Hamming separation between the previously designated code words and the current candidate code word is based on the allowed error transitions, as described above.

Similarly, the modified Hamming code word distance of the potential code including candidate code word $c_i$ can be determined before, or in parallel with the determination of the modified Hamming code word spacing of the potential code by any method known to one of skill in the art.

At step E, both the modified Hamming separation of the candidate code word from all of the previously designated code words and the modified Hamming distance from the candidate code word to each of the previously designated code words (and vice versa) are compared to the target minimum modified Hamming code word spacing and the target minimum modified Hamming code word distance for the code to be generated. If either the modified Hamming separation and the modified Hamming distances (i.e. to and from the candidate code word) are greater than or equal to the target minimum modified Hamming code word spacing and the target minimum modified Hamming code word distance, respectively, the candidate code word $c_i$ is designated as an actual code word $w_J$ at step F. If the modified Hamming separation is less than the target minimum modified Hamming code word spacing, or either of the minimum Hamming distances is less than the target minimum modified Hamming code word distance, the candidate code word $c_i$ is rejected as a code word. The process continues at step G.

At step G, the code-generating process is complete if either a sufficient number of code words have been designated to satisfy the initial parameters (in which case the code is complete), or sufficiently many potential code words have been rejected that a code cannot be generated that satisfies the initial parameters, or if all of the potential code words have been considered. If the process is incomplete, the process returns to step C to select and evaluate another candidate code word. If the process is complete and a sufficient number of code words have been designated, the process continues at step H, and the designated code words are assigned to the data words in a one-to-one correspondence. If the process is complete and a sufficient number of code words have not been designated, the process terminates in failure in that a code that meets the target characteristics has not been found. The process may optionally begin anew at step A by revising the initial parameters to be less restrictive, or may begin anew at step B by selecting a different first code word.

Step H makes the assignment of data words to code words in a one-to-one correspondence. This can be done by sequentially stepping through both sets assigning consecutive code words to consecutive data words. Alternatively, the assignment operation can be made randomly. Alternatively, the assignment can be made incrementally and in light of the implementation of the resulting channel encoder and channel decoder so as to yield a more effective implementation of one or the other or both those units. Alternatively, the assignment can be performed iteratively, with multiple assignments being tried and implemented and with the assignment that yielded the most desirable implementation of the encoder, decoder, or both being ultimately selected. The present invention is not limited to any particular method of performing the assignment of code words to data words.

In another embodiment, the method of FIG. 18 is coupled with methods well known in the art for logic optimization and logic synthesis to iteratively or in parallel find a plurality of codes and their encoder and decoder implementations in order to find a code for a particular situation that is efficient in time, area, and/or power.

To illustrate the operation of the method of FIG. 18, an example is presented based on the quaternary channel described by the error transition chart of FIG. 17, a code word size of four symbols and a minimum modified Hamming code word spacing of 4. For this example, Table J lists the steps followed by the method and the action for performed in each step.

TABLE J

| Step | | Action | Comment |
|---|---|---|---|
| 1 | A | m = 4; the set of all possible code words is the set of all 4-tuples of symbols, each drawn from the symbol set {a, b, c, d}. The error transition diagram for each symbol is shown in FIG. 17. The target modified Hamming code word separation is 4. | This will produce a SECDED code per Table 123. |
| 2 | B | set $w_1 = c_1 =$ "aaaa" set J = 1 | Select "aaaa" as the first candidate code word $c_1$ and designate it as the first code word $w_1$. The variable J is a running count of the designated code words. |
| 3 | C | set i = 1 + 1 = 2 select $c_2 =$ "baaa" | The variable i is a running count of number of selected candidate code words. The second candidate code word $c_2$ is selected to be "baaa". |
| 4 | D | mHd($w_1$, $c_2$) = 1 | The modified Hamming distance from designated code word $w_1$ to candidate $c_2$ is 1 because a single allowed error in the code word "aaaa" transforms it into "baaa". |
| 5 | E | Since mHd($w_1$, $c_2$) < 3, proceed to Step G | The candidate code word is too close to an existing code word to be designated another code word. |
| 6 | G | Not all possible code words have been selected so proceed to Step C | Only 2 of $4^4$ = 256 possible code words have been considered so far |
| 7 | C | Set i = 2 + 1 = 3 Select $c_3 =$ "caaa" | "caaa" is selected as the third candidate code word |
| 8 | D | mHs($w_1$, $c_3$) = 2 | The modified Hamming separation between "aaaa" to "caaa" is 2 because the modified Hamming distance from "caaa" to "baaa" is one, and the modified Hamming distance from "aaaa" to "baaa" is also one. |
| 9 | E | Since mHs($w_1$, $c_3$) < 4, proceed to Step G | The candidate code word is too close to an existing code word to be designated another code word. |
| 10 | G | Not all possible code words have been selected so proceed to Step C | |

TABLE J-continued

| Step | Action | | Comment |
|---|---|---|---|
| 11 | C | Set i = 3 + 1 = 4<br>Select $c_4$ = "daaa" | "daaa" is selected as the fourth candidate code word. |
| 12 | D | mHs($w_1$, $c_4$) = 3 | The modified Hamming separation between "aaaa" and "daaa" is 3 because the modified Hamming distance from "daaa" to "baaa" is two, and the modified Hamming distance from "aaaa" to "baaa" is also one. |
| 13 | E | Since mHs($w_1$, $c_4$) < 4, proceed to step G | |
| 14 | G | Not all possible code words have been selected so proceed to Step C | |
| 15 | C | set i = 4 + 1 = 5<br>select $c_5$ = "abaa" | "abaa" is selected as the fifth candidate code word. |
| 16 | D | mHd($w_1$, $c_5$) = 1 | The modified Hamming distance from "aaaa" ($w_1$) to "abaa" is only 1. |
| 17 | E | Since mHd($w_1$, $c_5$) < 3, proceed to Step G | "abaa" is too close to "aaaa" to also be a code word. |
| 18 | G | Not all possible code words have been selected so proceed to F | |
| | | And so on | |

Table K illustrates a code determined by the method of FIG. 18, as illustrated in Table J. In particular, it is a code for a quaternary channel with error transition chart shown in FIG. 17. It is representative of a code that is applicable to memories and channels that store or transmit two bits per cell or time period in which voltages or charges tend to only degrade to a midpoint. This code has a minimum modified Hamming code word spacing of 4, meaning it is a single error correcting, double error detecting code. In particular, the method of FIG. 18 finds 20 possible code words all at least distance 3 from each other. Table K illustrates 16 of those 20 code words being assigned per step H of FIG. 18 to the 16 possible 4-bit data words from a source data stream. Thus 4 quaternary symbols can store or transmit 4 bits of source data with full SECDED protection for each nibble. The present invention is not dependent on the particular assignment of codes to data words as assigned in Step M and any assignment that yields an efficient or desirable encoder and/or decoder is appropriate.

TABLE K

| | Code Word | Encoded Data Stream | Data Word |
|---|---|---|---|
| 1 | a a a a | 11 11 11 11 | 0 0 0 0 |
| 2 | d b a a | 01 10 11 11 | 0 0 0 1 |
| 3 | b d a a | 10 00 11 11 | |
| 4 | c a c a | 00 11 00 11 | 0 0 1 0 |
| 5 | a c c a | 11 00 00 11 | 0 0 1 1 |
| 6 | d d c a | 01 01 00 11 | 0 1 0 0 |
| 7 | b b b b | 10 10 10 10 | 0 1 0 1 |
| 8 | a a d b | 11 11 01 10 | |
| 9 | d b d b | 01 10 01 10 | 0 1 1 0 |
| 10 | b d d b | 10 01 01 10 | 0 1 1 1 |
| 11 | c a a c | 00 11 11 00 | 1 1 0 0 |
| 12 | a c a c | 11 00 11 00 | 1 1 1 0 |
| 13 | d d a c | 01 01 11 00 | 1 1 0 1 |
| 14 | c c c c | 00 00 00 00 | 1 1 1 1 |
| 15 | a a b d | 11 11 10 01 | |
| 16 | d b b d | 01 10 10 01 | 1 0 1 1 |
| 17 | b d b d | 10 01 10 01 | 1 0 1 0 |
| 18 | c a d d | 00 11 01 01 | |
| 19 | a c d d | 11 00 01 01 | 1 0 0 1 |
| 20 | d d d d | 01 01 01 01 | 1 0 0 0 |

If the channel characteristics are such that at most one error is possible in each symbol position, then there are fewer possible received words that are within distance two or more from a code word. For example, for a quaternary channel with error transition chart shown in FIG. 17, the received word is caaa is modified Hamming distance 2 from the code word aaaa, with both those errors occurring in the first error position. As a result, as shown in Table J, the candidate code word daaa is not a possible code word because its modified Hamming separation from code word aaaa is 3. However, if the probability of a second error in the same code word is zero or substantially less than a first error in another symbol in the transmitted or stored word, then it is possible that the overall probability of an undetected collection of errors may still be below the acceptable threshold even if the multiple errors within a single symbol are not correctly differentiated from a zero error or a single error in that symbol. In this example, if multiple errors within a single symbol are not considered in the formation of the code, then the modified Hamming distance from code word aaaa to the possible received word caaa is infinite. As a result, the modified Hamming separation between code word aaaa and the candidate code word daaa at entry 12 of Table J is infinite and candidate code word daaa can be designated the second code word by proceeding to Step F of the method of FIG. 18. Under this relaxed set of error conditions, the method of FIG. 18 finds 24 code words that satisfy the criteria for a SECDED code. These 24 code words with a possible assignment to data words are shown in Table L.

TABLE L

| | Code Word | Encoded Data Stream | Data Word |
|---|---|---|---|
| 1 | a a a a | 11 11 11 11 | 0 0 0 0 |
| 2 | d a a a | 01 11 11 11 | 0 0 0 1 |
| 3 | a d a a | 11 01 11 11 | |
| 4 | d d a a | 01 01 11 11 | 0 0 1 0 |
| 5 | b b b a | 10 10 10 11 | 0 0 1 1 |
| 6 | a a d a | 11 11 01 11 | 0 1 0 0 |
| 7 | d a d a | 01 11 01 11 | 0 1 0 1 |
| 8 | a d d a | 11 01 01 11 | |
| 9 | d d d a | 01 01 01 11 | |
| 10 | c c a b | 00 00 11 10 | 0 1 1 0 |
| 11 | c a c b | 00 11 00 10 | 0 1 1 1 |
| 12 | a c c b | 11 00 00 10 | |
| 13 | d b b c | 01 10 10 00 | |
| 14 | b d b c | 10 01 10 00 | 1 1 1 1 |
| 15 | b b d c | 10 10 01 00 | 1 1 1 0 |
| 16 | a a a d | 11 11 11 01 | |

TABLE L-continued

| | Code Word | Encoded Data Stream | Data Word |
|---|---|---|---|
| 17 | d a a d | 01 11 11 01 | |
| 18 | a d a d | 11 01 11 01 | 1 1 0 1 |
| 19 | d d a d | 01 01 11 01 | 1 1 0 0 |
| 20 | c c c d | 00 00 00 01 | 1 0 1 1 |
| 21 | a a d d | 11 11 01 01 | 1 0 1 0 |
| 22 | d a d d | 01 11 01 01 | |
| 23 | a d d d | 11 01 01 01 | 1 0 0 1 |
| 24 | d d d d | 01 01 01 01 | 1 0 0 0 |

Further, when the code word size m is 8 symbols the algorithm of FIG. 18 when searching for a SECDED code given the error transition chart of FIG. 17 finds 1762 possible code words if multiple errors per symbol are considered and 1866 possible code words if multiple errors per symbol are not considered.

It is significant that in both cases, when the code word size m is 4, the method of FIG. 18 finds more than 16 possible code words. If the information capacity of the code is considered to by $\log_2$ of the number of code words, the information capacity of the two 4-symbol codes is 4.322 bits and 4.585 bits respectively when multiple errors per consider are considered and not considered. Since the channel is a quaternary channel, the raw channel capacity needed to transmit or store 4 symbols is 8 bits. It is well known in the art that the information content of SECDED Hamming code using 8 transmitted or stored bits is 4 bits. Both the codes of the present invention presented in Tables K and L have greater efficiency than the comparable SECDED Hamming code.

With regard to step F, in the alternative all previously unselected candidate code words that are of Hamming separation d or less from the new code word $w_j$ can be marked as being too close to an existing code word to be code words themselves. They can be marked as essentially having been selected (and implicitly rejected) so that they will not be selected again in a future execution of step C, or marked for quick rejection in Step E when they are subsequently selected in step C. Other optimizations to facilitate more rapid finding an entire code are possible within the context of the present invention.

It will be understood that embodiments of the present invention may be applicable to other memory devices and communication devices that fundamentally have incomplete error injection properties. Other memory devices and communication channels may have a plurality of error injection mechanisms, one or more of which are much more probable than others. The substantially less probable mechanisms can be disregarded in order to model the devices or channels as ones with incomplete error injection properties.

In the foregoing specification, the invention has been described with reference to specific embodiments. It will be evident that various changes may be made to the embodiments disclosed without departing from the broader spirit and scope of the invention. The descriptions and drawings of those embodiments are, accordingly, to be regarded in an illustrative rather than a restrictive sense.

What is claimed is:

1. A transmitter for transmitting data into a channel, comprising:
   an input for receiving data from a data source;
   a channel encoder configured to encode the received data according to a code to produce encoded data, the code comprising a set of code words each comprising one or more symbols and corresponding to a data word of the data from the data source, wherein a minimum modified Hamming separation between any two code words of the set of code words is greater than a minimum Hamming distance between the two code words of the set of code words; and
   an output for transmitting the encoded data into the channel.

2. The transmitter of claim 1, wherein the channel is a communications channel.

3. The transmitter of claim 2, further comprising a modulator for modulating the encoded data for transmission over the communications channel.

4. The transmitter of claim 1, wherein the channel is a storage system comprising a plurality of memory cells.

5. The transmitter of claim 4, wherein the storage system is a semiconductor memory device.

6. The transmitter of claim 5, wherein the semiconductor memory device is a flash memory.

7. The transmitter of claim 6, wherein the flash memory device is a multi-level flash memory.

8. The transmitter of claim 5, wherein the semiconductor memory device is a dynamic random access memory (DRAM).

9. The transmitter of claim 8, wherein the DRAM is a multi-level DRAM.

10. The transmitter of claim 5, wherein the transmitter forms a part of a memory controller of the memory device.

11. A receiver for receiving data transmitted over a channel, comprising:
    an input for receiving data from the channel;
    a channel decoder configured to decode the received data according to a code to produce decoded data, the code comprising a set of code words each comprising one or more symbols and corresponding to a data word of data received from a data source, wherein a minimum modified Hamming separation between any two code words of the set of code words is greater than a minimum Hamming distance between the two code words of the set of code words; and
    an output for outputting the decoded data to a destination.

12. The receiver of claim 11, wherein the channel is a communications channel.

13. The receiver of claim 12, further comprising a demodulator for demodulating the data received from the communications channel.

14. The receiver of claim 11, wherein the channel is a storage system comprising a plurality of memory cells.

15. The receiver of claim 14, wherein the storage system is a semiconductor memory device.

16. The receiver of claim 15, wherein the semiconductor memory device is a flash memory.

17. The receiver of claim 16, wherein the flash memory is a multi-level flash memory.

18. The receiver of claim 15, wherein the semiconductor memory device is a dynamic random access memory (DRAM).

19. The receiver of claim 18, wherein the DRAM is a multi-level DRAM.

20. The receiver of claim 15, wherein the receiver forms a part of a memory controller of the memory device.

21. A semiconductor memory device, comprising:
    a plurality of memory cells for storing data; and
    a memory controller, the memory controller comprising:
       a transmitter comprising:
          an input for receiving data to be written in the memory cells;
          an encoder configured to encode the received data according to a code to produce encoded data, the code comprising a set of code words each comprising one or more symbols and corresponding to a data word of the received data, wherein a minimum modified Hamming separation between any two code words of the set of code words is greater than a minimum Hamming distance between the two code words of the set of code words; and an output for writing the encoded data to the memory cells; and a receiver comprising:

an input for receiving read data from the memory cells;

a decoder configured to decode the received data according to the code to produce decoded data; and an output for outputting the decoded data to a destination.

* * * * *